United States Patent [19]

Priel et al.

[11] 4,442,510
[45] Apr. 10, 1984

[54] SEMICONDUCTOR MEMORY BYTE CLEAR CIRCUIT

[75] Inventors: Ury Priel; Giora Yaron, both of Cupertino; Mark S. Ebel, Santa Clara, all of Calif.

[73] Assignee: National Semiconductor Corporation, Santa Clara, Calif.

[21] Appl. No.: 334,698

[22] Filed: Dec. 28, 1981

[51] Int. Cl.³ ............................................. G11C 11/40
[52] U.S. Cl. .................................................... 365/218
[58] Field of Search ................ 365/189, 218, 230, 185

[56] References Cited

U.S. PATENT DOCUMENTS 4,051,464 9/1977 Huang ................................. 365/218

OTHER PUBLICATIONS

W. S. Johnson et al., "A 16Kb Electrically Erasable Nonvolatile Memory," 1980 IEEE International Solid State Circuits Conference, pp. 152-154.

*Primary Examiner*—Joseph A. Popek
*Attorney, Agent, or Firm*—Michael J. Pollock; Paul J. Winters; Gail W. Woodward

[57] ABSTRACT

A circuit for clearing selected bytes in a semiconductor electrically alterable memory in which the ground lines for any one column of bytes is isolatable from the ground lines for other columns, all the outputs for the bytes are urged toward a non-clearing condition, and the outputs for only the selected byte are used to introduce a clearing signal that dominates the non-clearing condition.

10 Claims, 1 Drawing Figure

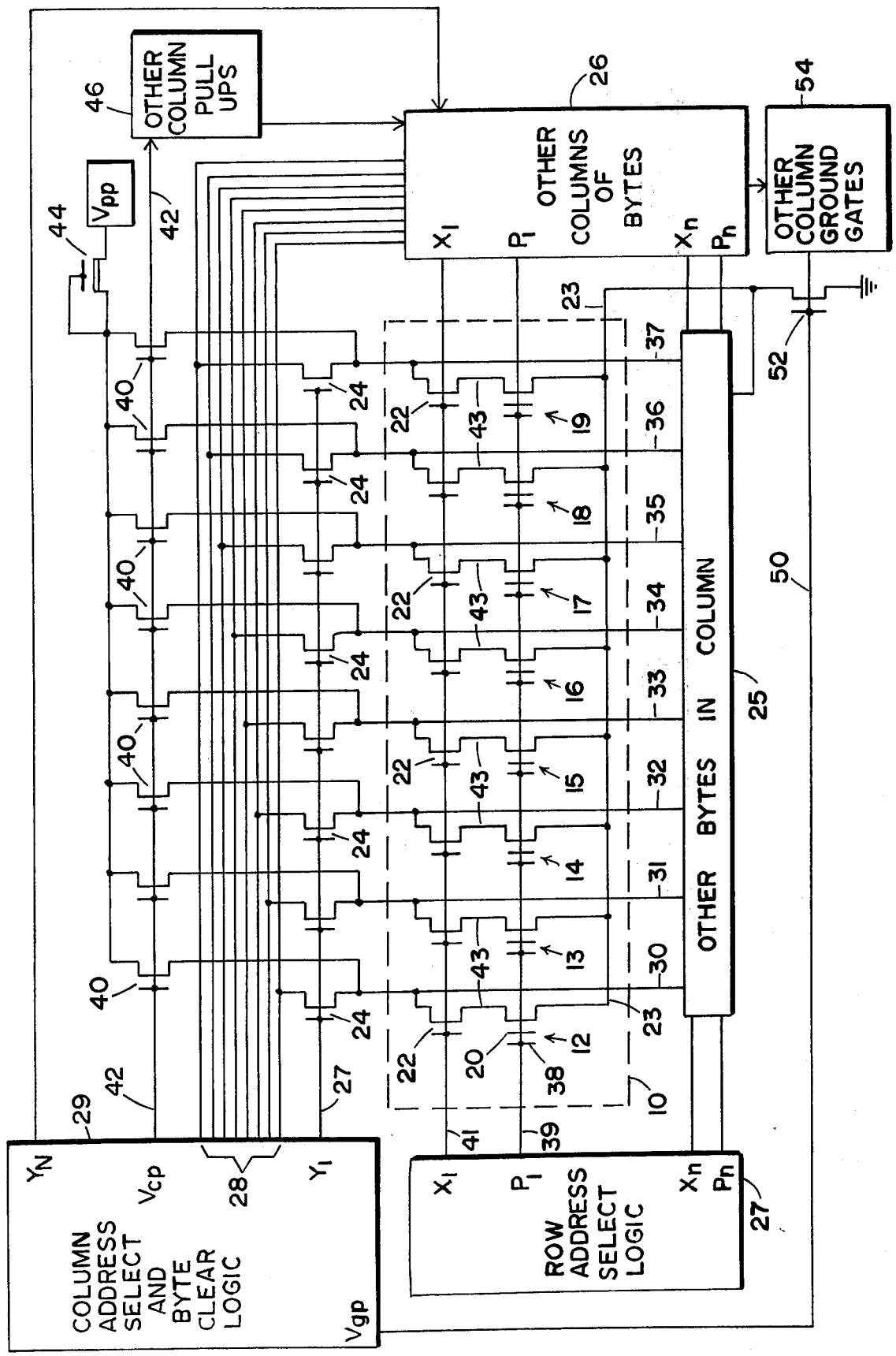

SEMICONDUCTOR MEMORY BYTE CLEAR CIRCUIT

BACKGROUND OF THE INVENTION

This invention relates to the field of electrically alterable read-only semiconductor memories. More specifically, this invention is described with respect to the type of memory that utilizes floating gate field effect transistors as storage cells. Each storage cell, which may also include a selection transistor therein, stores one bit of information. Typically, eight bits or eight storage cells are logically grouped together to form a byte. The bytes are organized in an array of rows and columns. Thus, if 16 columns are utilized with each column containing 128 rows, an array of 2,048 bytes is produced on a single semiconductor chip.

The prior art recognizes the desirability for being able to clear these memories one byte at a time if desired. Such a feature permits the user to change the contents of a single eight-bit byte by erasing only that byte and then entering new data into the byte. Without the feature, it would be necessary to empty the entire contents of the memory into a temporary buffer memory where the required byte could be altered and then to rewrite all 2,048 bytes back into the semiconductor memory chip.

One typical prior art approach for clearing a single byte involves positioning a special transistor in the vicinity of each byte on the chip, operable in response to an X address signal and a Y address signal, to clear only the eight storage cells in the selected byte. The disadvantage of this prior art approach is that 2,048 additional transistors are required to operate the 16 by 128 byte array mentioned above. Furthermore, each column of bytes requires an extra metal line to supply the Y address signal to the special transistors associated with each byte in that column. These additional transistors and metal lines reduce the density of parts on the chip and require larger chips to accommodate the same storage capacity. The present invention, however, permits greater density in the memory array by providing a circuit wherein the selection devices necessary to select an individual byte for clearing may be positioned at the periphery of the array rather than dispersed throughout the array. As a result, each column may operate with one less signal line and one less transistor per byte.

SUMMARY OF THE INVENTION

Briefly, the present invention contemplates means to isolate the ground path for each column of bytes during the clearing process so that the appropriate clearing signal can be introduced through the conventional input/output lines that are normally used to write data in and read data out of the memory. In order to prevent unselected bytes from being cleared, each of the columns is connected to a weak pull-up transistor which operates to prevent a clearing signal from accidentally being present in the bytes in the column unless the weak pull-up signal is overpowered by the intentional introduction of a clearing signal, which happens only at a specific selected byte. Hence, it is unnecessary to use a switching device at each byte in order to electrically isolate the byte. Rather, the present invention can clear a particular byte by introducing a clearing signal in such a way that the signal will only be strong enough at the selected byte to achieve a clearing operation.

BRIEF DESCRIPTION OF THE DRAWING

The drawing presents a schematic diagram of the byte clear circuit utilized in the preferred embodiment of this invention.

DESCRIPTION OF THE PREFERRED EMBODIMENT

In the drawing, a typical memory is schematically diagrammed, along with some typical peripheral circuits, and also the specific peripheral circuits necessary to accomplish the byte clear function of the present invention. One byte is completely diagrammed inside the dashed line 10. Byte 10 comprises eight storage cells, 12 through 19. Each storage cell is essentially identical and includes a floating gate transistor 20 and a select transistor 22. The storage cells 12 through 19 are connected to a common ground line 23 at one end and coupled at the other end through their select transistors 22 to a series of output lines 30 through 37. Output lines 30 through 37 connect respectively to a group of input/output lines 28 through a series of eight Y address selection transistor 24.

Byte 10 may be thought of as the top byte in a column of bytes in which the other bytes in the column are represented by box 25 in the drawing. Additional columns of bytes are represented by box 26 in the drawing. In conventional memory writing and reading operations, individual bits or bytes may be selected by introducing signals $X_1$ through $X_N$ and $P_1$ through $P_N$ from a row address select means 27 and signals $Y_1$ through $Y_N$ from a column address select and byte clear logic means 29. The circuitry necessary to create the desired address signals is well known to those skilled in the art and therefore not discussed in detail herein.

For the purposes of explanation, it is convenient to refer to a typical storage cell such as cell 12. Cell 12 may be cleared by the introduction of 0 volts at point 43 in combination with the application of a 20 volt $P_1$ signal to a control gate 38 in floating gate transistor 20. In so doing, a charge will be caused to jump from the drain region of transistor 20 to the floating gate. The charge on the floating gate inhibits current flow in device 20 during the application of a conventional 5 volt $P_1$ read signal to the control gate 38. In a like manner, all of the other storage cells 13 through 19 may be cleared by the application of a 20 volt $P_1$ pulse on program line 39 from row address select means 27 in combination with the application of 0 volts to the points 43 on each of transistors 20.

In order to clear out one particular selected byte, three signals are required. Column address select and byte clear logic means 29 provides these three signals. Logic 29 introduces a 0-volt signal on input/output lines 28. In addition, byte 10 is selected in a conventional manner by the application of a $Y_1$ signal on line 27 which operates to turn on a series of eight address selection transistors 24, so as to connect output lines 30 through 37 to input/output lines 28 and the 0 volt signal thereon. Transistors 24 thus present a 0 volt signal to each of the select transistors 22 in the storage cells 12 through 19. The selection of byte 10 is further accomplished by the generation of an $X_1$ signal on line 41 from row address select means 27 which operates to turn on transistors 22 so as to convey the 0 volt signal to point 43 in each of the storage cells. The combination of this 0 volt signal in the drain regions of floating gate transistors 20 with a 20 volt $P_1$ signal on line 39 clears all of the floating gate transistors 20 in the storage cells 12 through 19. Hence, the entire byte 10 is cleared simultaneously.

Since the selection signals $X_1$ and $P_1$ are transmitted across an entire row of bytes and through several other columns of bytes 26, other bytes could be cleared as well if they were permitted to have an accidental 0 volt signal on their respective output lines. To prevent this, the output lines of all the other columns are caused to have a higher voltage by means of a clear prevention signal device 44, which operates through a series of transistors 40, and in response to a signal $V_{CP}$ on line 42, to apply a clear prevention signal to output lines 30 through 37. In the preferred embodiment, clear prevention signal means 44 comprises a high impedance, weak pull-up, transistor, connected as shown to the output lines 30 through 37 in byte 10. Weak pull-up transistor 44 is also connected to a source of voltage $V_{pp}$, which in the preferred embodiment is chosen to be 20 volts. This 20 volt signal is applied to the output lines 30 through 37.

However, in the case of byte 10, the 0 volt signal applied by input/output lines 28 is sufficient to overcome the 20 volt signal which transistor 44 is attempting to establish and establish itself on output lines 30 through 37. As a result, in the case of byte 10, the storage cells 12 through 19 are cleared anyway. However, in the case of the other columns 26, there is no 0 volt signal applied through output lines 28 because the signal $Y_1$ on line 27 is not applied to the other columns 26. The other columns 26 are connected to other column pull-ups 46, as shown in the drawing, and since the other column pull-ups 46 are also activated by the signal $V_{CP}$ on line 42, all of the other columns will be prevented from having a 0 volt signal on their output lines corresponding to lines 30 through 37. Thus, none of the bytes in the other columns will be cleared.

Another way that the 0 volt signal on output lines 30 through 37 could reach other columns would be through an accidental ground loop path. To prevent this, each of the ground lines 23 of an individual column are isolated from the ground lines in other columns by means of an isolation means which in the preferred embodiment comprises a ground isolating transistor 52. Transistor 52 is turned off during a byte clear operation by a signal $V_{GP}$ presented by logic circuit 29 through a line 50. The signal on line 50 also goes to a series of other column ground gates 54 which control the connections on the ground lines 23 in the other columns 26. Thus, during the byte clear process, the grounds for each column of bytes are isolated from each other and floated through the action of a number of transistors 52 and 54 operating in response to the signal on line 50.

It may be seen, therefore, that all of the columns are urged toward a positive voltage on their output lines by means of a series of weak pull-up transistors 44 and 46 so that a clear signal is effective only in the specific byte at which the 0 voltage on output lines 28 is presented. The $Y_N$ signal from logic 29 controls the introduction of the 0 volt signal on lines 28 into the selected byte (byte 10 in the case of the drawing) so that it can overpower and dominate the weak pull-up transistor 44 and allow a clearing action to take place. Various modifications to the circuits shown will occur to those skilled in the art, including other means to isolate the column grounds from each other and other means to urge the column voltages positive during the byte clear operation. Accordingly, we intend to be bound only by the, appended claims.

What is claimed is:

1. Apparatus to permit clearing individual bytes in an electrically alterable read-only memory of the type having a clear signal generating means for generating a clear signal, a row and column address select means, and an array of rows and columns of bytes, each byte comprising a plurality of storage cells, each of which cells include at least one switching device that can be cleared by the application of said clear signal thereto, said switching device connected between a ground line and an output line, comprising:

ground isolating means, operable in response to the reception of a first signal, to isolate the ground lines for the switching devices in the bytes in one column from the ground lines for the switching devices in the bytes of the other columns;

first connecting means, operable in response to the reception of a second signal, to connect the output lines for the switching devices in the bytes in said one column to the clear signal generating means;

a clear prevention signal generating means for generating a clear prevention signal; and second connecting means, operable in response to the reception of a third signal, to connect said output lines for the switching devices in the bytes in said columns to the clear prevention signal generating means, said clear signal being sufficient to overcome said clear prevention signal when both said clear signal and said clear prevention signal are applied to said output lines.

2. The apparatus of claim 1, in combination with a byte clear logic circuit, which circuit is operable to generate said first signal, said third signal, said second signal, and said clear signal.

3. The apparatus of claim 1 in which said clear prevention signal generating means comprises a high impedance, weak pull-up, transistor device for urging a positive voltage on the output lines.

4. The apparatus of claim 1 in which said ground isolating means comprises electrical interconnections between the ground lines for all of the switching devices in all of the bytes in said one column and a common path, said common path connected through a first gate to ground, said first gate operable in response to said first signal and further comprises similar electrical interconnections between the ground lines for the switching devices in the bytes in each of the other columns and other common paths, said other common paths also connected to ground through other gates, said other gates also operable in response to said first signal.

5. The apparatus of claim 4 in which said clear prevention signal generating means comprises a high impedance, weak pull-up, transistor device for urging a positive voltage on the output lines.

6. The apparatus of claim 5 in which said first connecting means comprises gates in series with the output lines so as to permit signals to pass therethrough during clearing, read, and write operations.

7. The apparatus of claim 6 in which said second connecting means comprise a plurality of gates connected between said output lines and said clear prevention signal generating means.

8. The apparatus of claim 7 in combination with a byte clear logic circuit, which circuit is operable to generate said first signal, said third signal, said second signal, and said clear signal.

9. The apparatus of claim 1 in which said first connecting means comprises gates in series with the output lines so as to permit signals to pass therethrough during clearing, read, and write operations.

10. The apparatus of claim 1 in which said second connecting means comprise a plurality of gates connected between said output lines and said clear prevention signal generating means.

* * * * *